(12) United States Patent
Maurer et al.

(10) Patent No.: US 9,099,987 B2
(45) Date of Patent: Aug. 4, 2015

(54) FILTER ARRANGEMENT AND METHOD FOR PRODUCING A FILTER ARRANGEMENT

(75) Inventors: Gerhard Maurer, Germering (DE); Edgar Schmidhammer, Stein An Der Traun (DE)

(73) Assignee: EPCOS AG, Munich (DE)

( * ) Notice: Subject to any disclaimer, the term of this patent is extended or adjusted under 35 U.S.C. 154(b) by 129 days.

(21) Appl. No.: 13/997,168

(22) PCT Filed: Dec. 22, 2011

(86) PCT No.: PCT/EP2011/073849
§ 371 (c)(1),
(2), (4) Date: Aug. 26, 2013

(87) PCT Pub. No.: WO2012/085235
PCT Pub. Date: Jun. 28, 2012

(65) Prior Publication Data
US 2013/0335164 A1    Dec. 19, 2013

(30) Foreign Application Priority Data

Dec. 22, 2010  (DE) .......................... 10 2010 055 649

(51) Int. Cl.
| H01L 41/00 | (2013.01) |
| H03H 9/00 | (2006.01) |
| H03H 9/70 | (2006.01) |
| H03H 9/60 | (2006.01) |
| H03H 9/64 | (2006.01) |
| H03H 9/72 | (2006.01) |
| H03H 3/00 | (2006.01) |

(52) U.S. Cl.
CPC ................ *H03H 9/703* (2013.01); *H03H 3/00* (2013.01); *H03H 9/605* (2013.01); *H03H 9/6483* (2013.01); *H03H 9/70* (2013.01); *H03H 9/706* (2013.01); *H03H 9/725* (2013.01); *Y10T 29/49016* (2015.01)

(58) Field of Classification Search
None
See application file for complete search history.

(56) References Cited

U.S. PATENT DOCUMENTS

| 6,927,649 | B2 * | 8/2005 | Metzger et al. ................ 333/133 |
| 7,126,441 | B2 * | 10/2006 | Adachi et al. ................. 333/133 |
| 7,253,704 | B2 * | 8/2007 | Park et al. ..................... 333/133 |
| 7,301,420 | B2 | 11/2007 | Yamaguchi et al. |
| 7,339,445 | B2 * | 3/2008 | Aigner et al. ................. 333/133 |
| 7,498,899 | B2 * | 3/2009 | Iwaki et al. ................... 333/133 |
| 7,821,357 | B2 * | 10/2010 | Heinze et al. ................. 333/133 |
| 7,821,358 | B2 * | 10/2010 | Block et al. ................... 333/133 |

(Continued)

FOREIGN PATENT DOCUMENTS

| CN | 1394389 A | 1/2003 |
| DE | 102006033709 A1 | 1/2008 |

(Continued)

*Primary Examiner* — Tuan T Lam
(74) *Attorney, Agent, or Firm* — McDermott Will & Emery LLP

(57) ABSTRACT

The invention relates to a filter arrangement (10) comprising a substrate (16) having a first series resonator (11) and a first and a second parallel resonator (12, 13). The filter arrangement (10) further comprises a carrier (18), on which the substrate (16) is arranged and which comprises a first inductor (17), the first connection of which is coupled to a first connection of the first series resonator (11) by means of the first parallel resonator (12) and to a second connection of the first series resonator (11) by means of the second parallel resonator (13).

5 Claims, 5 Drawing Sheets

(56) References Cited

U.S. PATENT DOCUMENTS

Figure 1A:
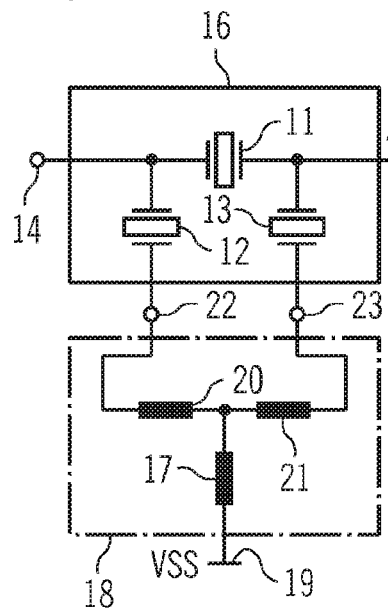

| | | | |
|---|---|---|---|
| 8,558,356 B2* | 10/2013 | Kiwitt et al. | 257/664 |
| 2003/0058066 A1 | 3/2003 | Taniguchi et al. | |
| 2003/0227357 A1 | 12/2003 | Metzger et al. | |
| 2005/0099244 A1* | 5/2005 | Nakamura et al. | 333/133 |
| 2005/0167854 A1* | 8/2005 | Tikka et al. | 257/787 |
| 2008/0100397 A1 | 5/2008 | Nam et al. | |
| 2009/0174497 A1* | 7/2009 | Korden | 333/100 |
| 2010/0091473 A1* | 4/2010 | Kiwitt et al. | 361/782 |

FOREIGN PATENT DOCUMENTS

| | | |
|---|---|---|
| EP | 1225695 B1 | 7/2008 |
| WO | 2005050840 A2 | 6/2005 |
| WO | 2007088683 A1 | 8/2007 |

* cited by examiner

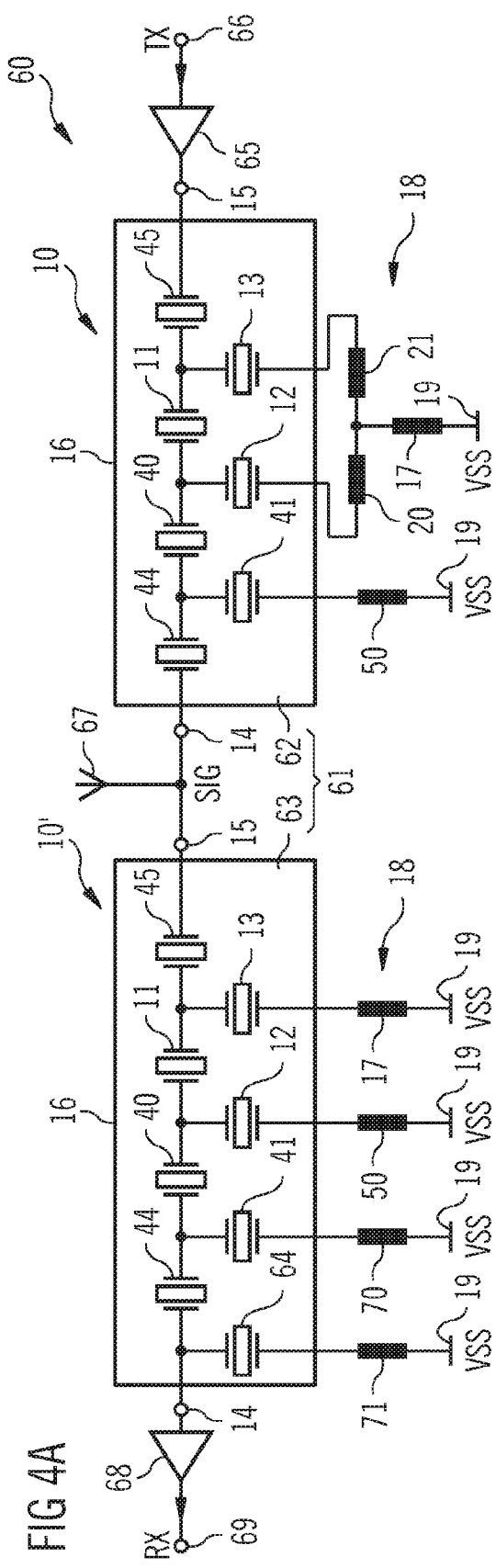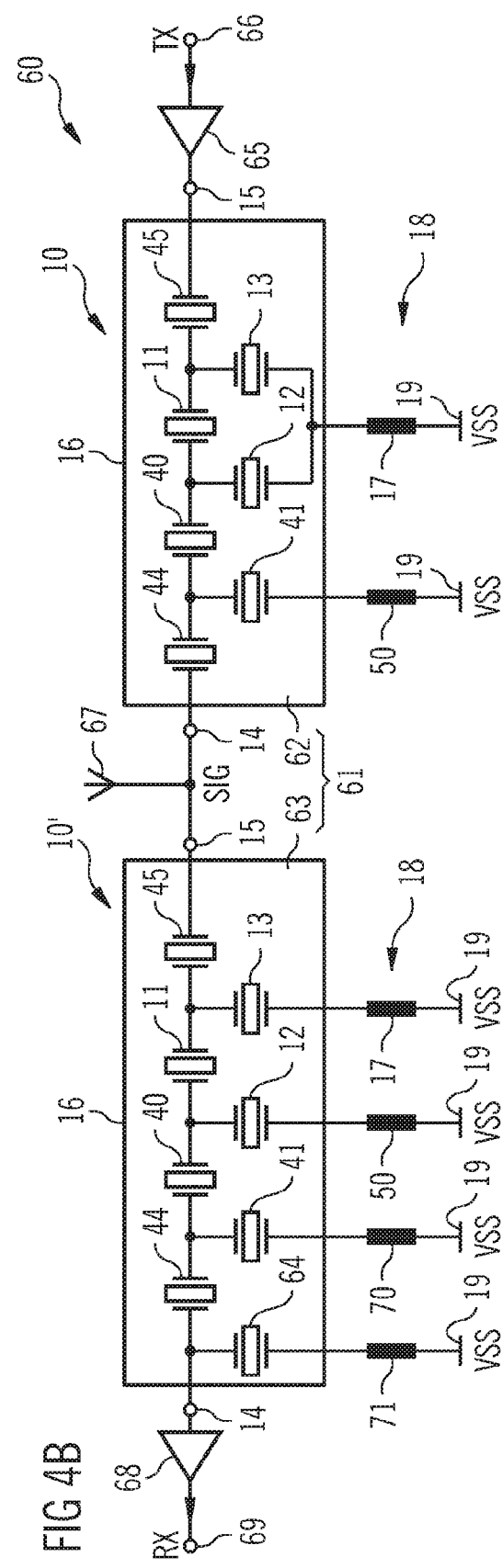

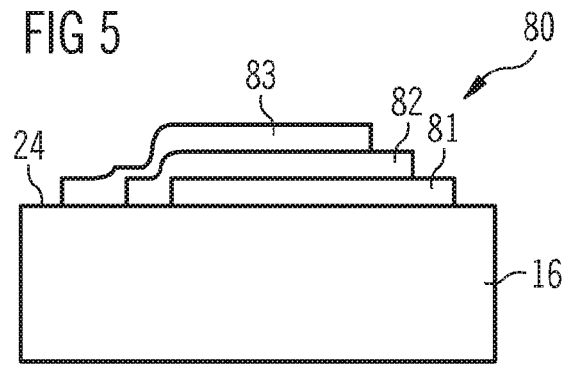
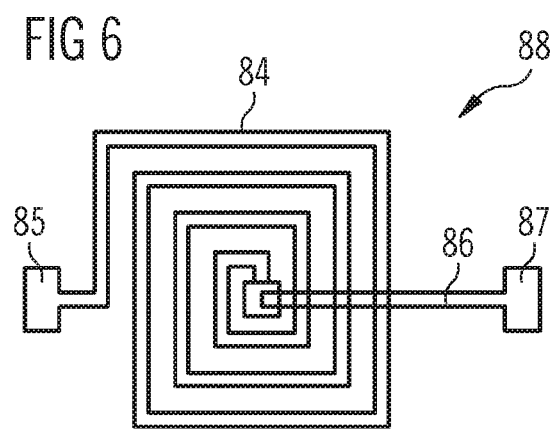
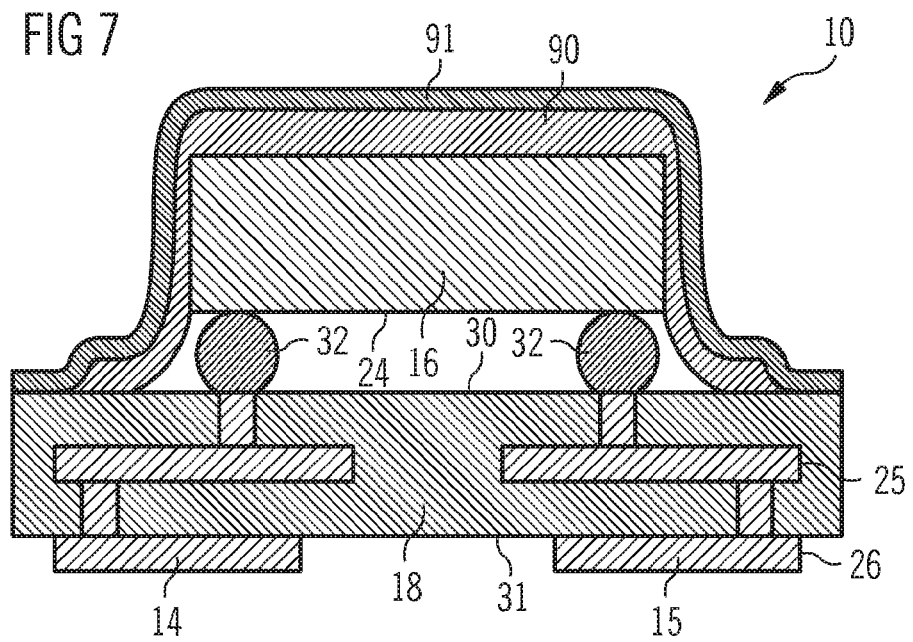

FILTER ARRANGEMENT AND METHOD FOR PRODUCING A FILTER ARRANGEMENT

The present invention relates to a filter arrangement and to a method for producing a filter arrangement.

A filter arrangement can comprise for example an inductance, a capacitor, a bulk acoustic wave filter or a surface acoustic wave filter. Duplexers are used in radio systems in order to guide a transmission signal output by a transmission amplifier to an antenna and a reception signal from the antenna to a reception amplifier. For this purpose, the duplexer has a first filter arrangement as a transmission filter and a second filter arrangement as a reception filter.

Document US 2008/0100397 A1 is concerned with a bulk acoustic wave filter and a duplexer. The duplexer has a series resonator, two shunt resonators and two inductances, which are integrated on a single chip.

Document EP 1 225 695 A2 describes a monolithic duplexer. A plurality of bulk acoustic wave filters and a coil are arranged on a glass substrate. In order to produce the bulk acoustic wave filters and the coil, the substrate is processed with a multiplicity of production steps.

It is an object of the present invention to provide a filter arrangement and a method for producing a filter arrangement which enable a flexible choice of the production methods.

This object is achieved by the subjects of the independent claims. The dependent claims in each case relate to developments and configurations.

In one embodiment, a filter arrangement comprises a substrate and a carrier. The substrate comprises a first series resonator and also a first and a second parallel resonator. The substrate is arranged on the carrier. The carrier has a first inductance. A first connection of the inductance is coupled to a first connection of the first series resonator via the first parallel resonator. Furthermore, the first connection of the first inductance is coupled to a second connection of the first series resonator via the second parallel resonator.

Advantageously, the first series resonator and also the first and second parallel resonators are arranged on the substrate, and the first inductance is arranged on the carrier. The production processes for producing the first series resonator and also the first and second parallel resonators on the substrate can thus be optimized separately from the processes for producing the inductance on the carrier.

In one embodiment, the substrate and the carrier form a stack arrangement. The stack arrangement enables a space-saving realization of the filter arrangement since the first inductance, the first series resonator and also the first and second parallel resonators are arranged at least partly one above another and are therefore not arranged alongside one another on a support. The substrate can be applied on the carrier using flip-chip technology.

In one embodiment, the substrate is monocrystalline.

The substrate can be a semiconductor body or an insulator body. The substrate can be implemented as a silicon body such as, for example, as a silicon wafer or silicon chip. Alternatively, the substrate can be realized as a quartz body.

In one embodiment, the number of series resonators of the filter arrangement is at least of the same magnitude as the number of parallel resonators of the filter arrangement. The number of series resonators of the filter arrangement can be greater than the number of parallel resonators of the filter arrangement.

In one embodiment, a first connection of the first parallel resonator is connected to a first connection of the second parallel resonator via exactly a single series resonator, namely the series resonator.

In one embodiment, a duplexer comprises a reception filter and a transmission filter. The reception filter can be embodied as a filter arrangement. The transmission filter can likewise be realized as a filter arrangement. The duplexer is embodied as a surface acoustic wave/bulk acoustic wave duplexer.

In one embodiment, a method for producing a filter arrangement comprises producing a first series resonator and also a first and a second parallel resonator on a substrate. Furthermore, a first inductance is produced on a carrier. Furthermore, the substrate is arranged on the carrier. For this purpose, the substrate is mechanically connected to the carrier. Furthermore, the substrate is electrically conductively connected to the carrier. In this case, a first connection of the first inductance is electrically conductively connected to a first connection of the first series resonator via the first parallel resonator and to a second connection of the first series resonator via the second parallel resonator.

The substrate is advantageously produced separately from the carrier. The processes for producing the first series resonator and also the first and second parallel resonators can thus be chosen separately from the processes for producing the inductance. Furthermore, as material for the substrate and as material for the carrier it is possible to choose in each case that material which is particularly well suited to the production of the series resonator, of the first and second parallel resonators and of the first inductance, respectively.

In one embodiment, the carrier has at least two metallization layers. The carrier can comprise at least three metallization layers.

Figure 8A:
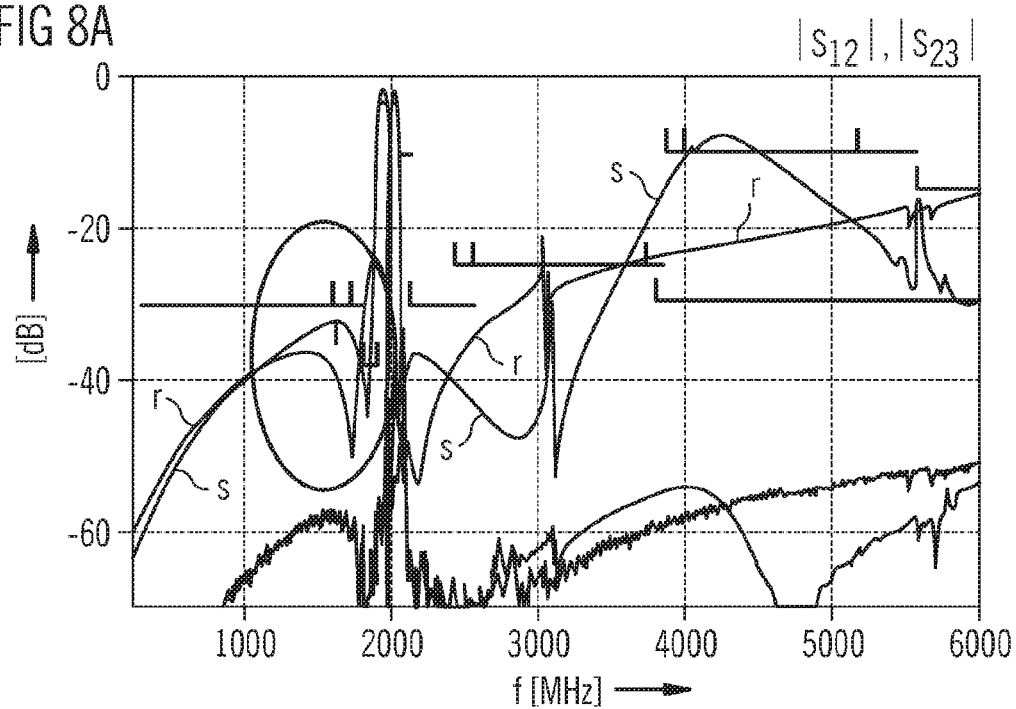
Figure 8B:
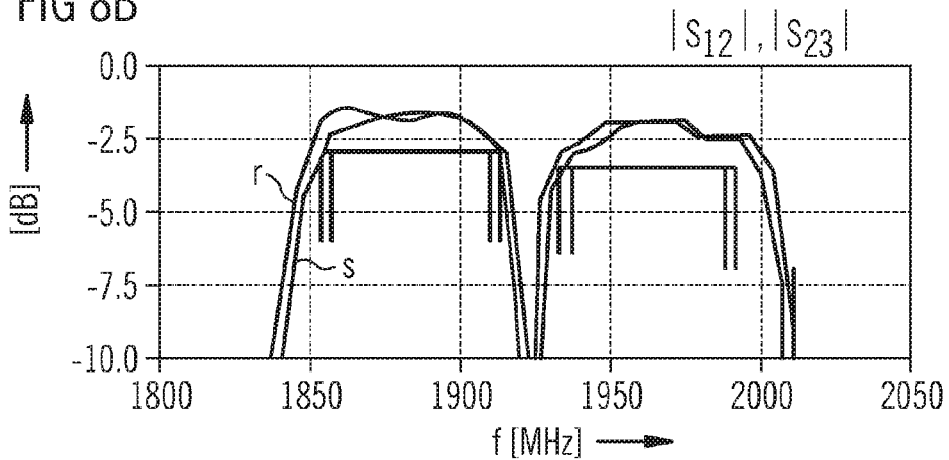
Figure 8C:
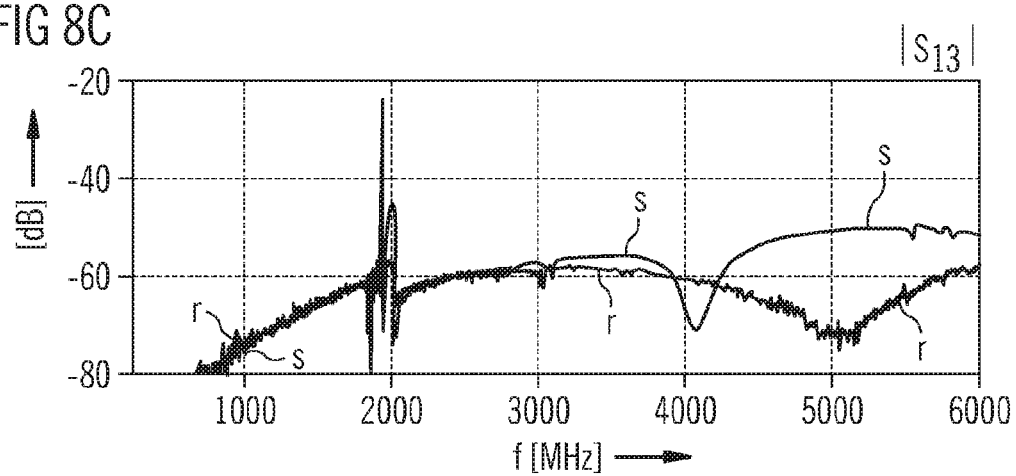

The invention is explained in greater detail below on the basis of a plurality of exemplary embodiments with reference to the figures. Functionally or operatively identical structures, components and circuit elements bear identical reference signs. Insofar as structures, components or circuit parts correspond to one another in terms of their function, the description thereof will not be repeated in each of the following figures, in which FIGS. 1A, 1B, 2A and 2B show exemplary embodiments of a filter arrangement as circuit diagram and in cross section, FIGS. 3A to 3D shows further exemplary embodiments of a filter arrangement, FIGS. 4A and 4B show exemplary embodiments of a radio system, FIG. 5 shows an exemplary embodiment of a bulk acoustic wave resonator, FIG. 6 shows an exemplary embodiment of an inductance, FIG. 7 shows an exemplary embodiment of a filter arrangement in a housing, and FIGS. 8A to 8C show exemplary characteristics of a filter arrangement.

FIG. 1A shows an exemplary filter arrangement 10 according to the principle proposed. The filter arrangement 10 comprises the first series resonator 11 and also a first and a second parallel resonator 12, 13. A first filter terminal 14 of the filter arrangement 10 is coupled to a second filter terminal 15 of the filter arrangement 10 via the first series resonator 11. A first connection of the first parallel resonator 12 is connected to a node between the first filter terminal 14 and the first series resonator 11. Correspondingly, a first connection of the second parallel resonator 13 is connected to a node between the first series resonator 11 and the second filter terminal 15. A substrate 16 of the filter arrangement 10 comprises the first series resonator 11 and also the first and second parallel resonators 12, 13.

Furthermore, the filter arrangement 10 comprises a first inductance 17. A first connection of the first inductance 17 is connected to a first connection of the first series resonator 11 via the first parallel resonator 12. Furthermore, the first connection of the first inductance 17 is connected to a second connection of the first series resonator 11 via the second parallel resonator 13. For this purpose, the first connection of the first inductance 17 is connected to a second connection of the first parallel resonator 12 and to a second connection of the second parallel resonator 13. Furthermore, the substrate 16 comprises a first ground connection pad 22. Via the first ground connection pad 22, the first parallel resonator 12 is coupled to the first connection of the first inductance 17. Furthermore, the substrate 16 comprises a second ground connection pad 23. The second ground connection pad 23 couples the second parallel resonator 13 to the first connection of the first inductance 17. A carrier 18 of the filter arrangement 10 comprises the first inductance 17. A second connection of the first inductance 17 is connected to a reference potential connection 19. A reference potential VSS can be tapped off at the reference potential connection 19.

The filter arrangement 10 additionally comprises a first coupling inductance 20, which connects the first connection of the first inductance 17 to the first parallel resonator 12. Furthermore, the filter arrangement 10 comprises a second coupling inductance 21, which connects the first connection of the first inductance 17 to the second parallel resonator 13. The first and second coupling inductances 20, 21 are arranged on the carrier 18.

The first inductance 17 is advantageously used for the coupling both of the first and of the second parallel resonators 12, 13 to the reference potential connection 19. As a result, the area for realizing inductances on the carrier 18 can advantageously be kept small.

Figure 1B:
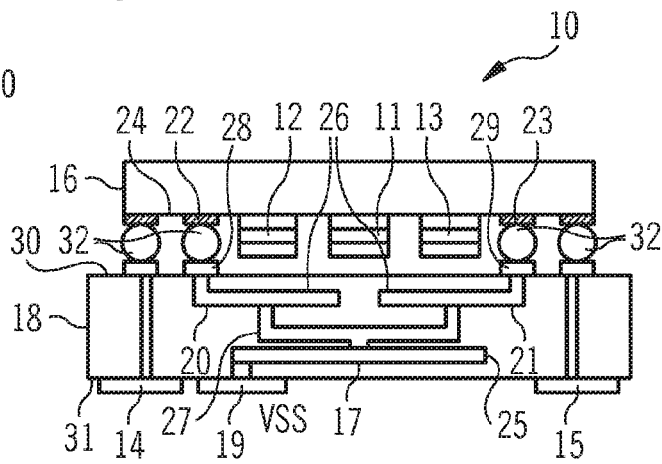

FIG. 1B shows an exemplary cross section of the filter arrangement 10 as shown in FIG. 1A. The substrate 16 and the carrier 18 are arranged one on top of the other as a stack arrangement. The first series resonator 11 and also the first and second parallel resonators 12, 13 are arranged on a first main area 24 of the substrate 16. Furthermore, the first and second ground connection pads 22, 23 are arranged on the first main area 24 of the substrate 16. For reasons of clarity, the connections between the resonators 11, 12, 13 and the ground connection pads 22, 23 on the substrate 16 are not depicted. The first inductance 17 is integrated into the carrier 18. The first and second coupling inductances 20, 21 are likewise integrated in the carrier 18. The carrier 18 has a first metallization layer 25. The first inductance 17 comprises a conductor track in the first metallization layer 25. Furthermore, the carrier 18 has a second metallization layer 26. The first and second coupling inductances 21, 22 each comprise conductor tracks in the second metallization layer 26. A third metallization layer 27 of the carrier 18 connects the first and second coupling inductances 20, 21 to the first inductance 17. An insulation layer of the carrier 18 is in each case arranged between two adjacent metallization layers.

Furthermore, a first main area 30 of the carrier 18 comprises a first connection pad 28, which is connected to the first ground connection pad 22 of the substrate 16. A solder ball 32 or a solder bump is arranged between the first ground connection pad 22 and the first connection pad 28. Correspondingly, the carrier 18 comprises a second connection pad 29, which is arranged on the first main area 30 of the carrier 18. The second connection pad 29 is connected to the second ground connection pad 23 of the substrate 16. A solder ball 32 or a solder bump is likewise arranged between the second connection pad 29 and the second ground connection pad 23.

The first filter terminal 14 of the filter arrangement 10 is arranged as a connection pad on a second main area 31 of the carrier 18. The connection pad 14 is coupled to the first connection of the first series resonator 11 via one or a plurality of plated-through holes in the carrier 18, a connection pad on the first main area 30 of the carrier 18, a solder bump or solder ball 32 and a connection pad on the first main area 24 of the substrate 16. A plated-through hole can be designated as a via. Correspondingly, the second filter terminal 15 is realized as a connection pad on the second main area 31 of the carrier 18. The second filter terminal 15 is coupled to the second connection of the first series resonator 11 via one or a plurality of plated-through holes in the carrier 18, a connection pad on the first main area 30 of the carrier 18, a solder bump or a solder ball 32 and a connection pad on the first main area 24 of the substrate 16. The reference potential connection 19 is implemented as a connection pad on the second main area 31 of the carrier 18.

FIGS. 1A and 1B schematically show the linking of two parallel resonators, namely of the first and second parallel resonators 12, 13, for example in a transmission branch. In this case, the first and second parallel resonators 12, 13 are individually led out from the substrate 16 and interconnected in the carrier 18. The substrate 16 is realized as a chip. The carrier 18 is a ceramic. The ceramic is multilayered. The ceramic comprises at least one passive component, such as, for instance, the first inductance 17. The ceramic has a plurality of metallization layers 25, 26, 27. The at least one passive component is realized with metal structures on the individual layers 25, 26, 27. Consequently, the filter arrangement 10 is advantageously realized in a space-saving manner.

In an alternative embodiment (not shown), the first coupling inductance 20 is omitted and replaced by a conductor track. Alternatively or additionally, the second coupling inductance 21 can be omitted and replaced by a conductor track.

In an alternative embodiment (not shown), the carrier additionally has ground webs which decouple different structures on the carrier 18, in particular the inductances 17, 22, 21.

Figure 2A:
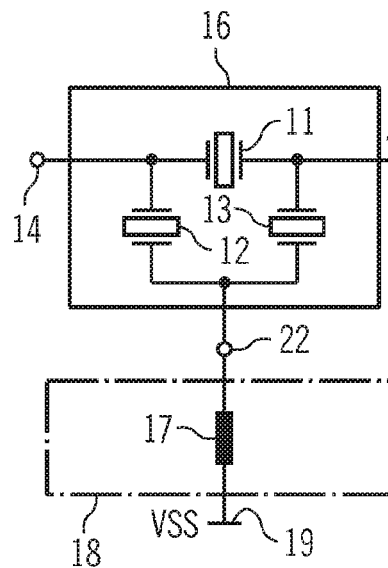

FIG. 2A shows a further exemplary embodiment of the filter arrangement 10 according to the principle proposed. In this case, the second connection of the first parallel resonator 12 is connected to the second connection of the second parallel resonator 13. The connection of the second connections of the first and second parallel resonators 12, is realized on the substrate 16. The first ground connection pad 22 is thus connected to the second connection of the first parallel resonator 12 and to the second connection of the second parallel resonator 13. The first ground connection pad 22 is coupled to the first connection of the first inductance 17. Consequently, the second ground connection pad 23 and also the first and second coupling inductances 20, 21 are omitted. The space requirement for the realization on the substrate 16 is thus reduced further.

Figure 2B:
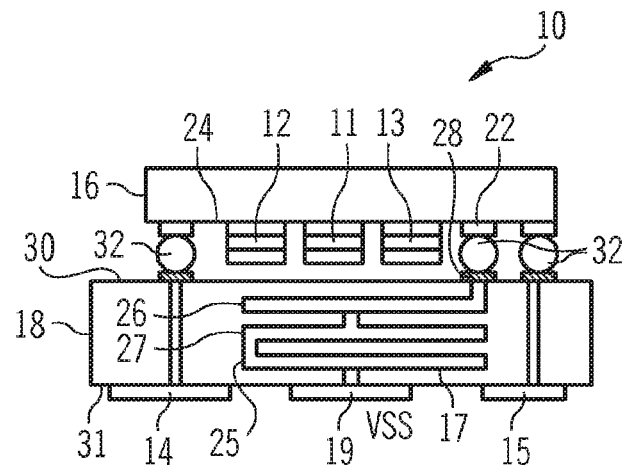

FIG. 2B shows an exemplary cross section of the filter arrangement 10 as shown in FIG. 2A. The first ground connection pad 22 and also the connection pads for the first and second filter terminals 14, 15, the first series resonator 11 and also the first and second parallel resonators 12, 13 are thus arranged on the carrier 18. The first inductance 17 comprises conductor tracks in at least two metallization layers, namely the first, second and third metallization layers 25, 26, 27. The conductor tracks of the first inductance 17 are realized as turns lying one above another in the at least two metallization layers, namely the first, second and third metallization layers 25, 26, 27. Consequently, two parallel resonators, namely the first and second parallel resonators 12, 13, are combined on the substrate 16. The substrate 16 is implemented as a bulk acoustic wave chip.

In one embodiment, it is possible to realize the turn of the first inductance 17 in at least one metallization layer from a group comprising the first, second and third metallization layers 25, 26, 27 in a spiral fashion.

Figure 3A:
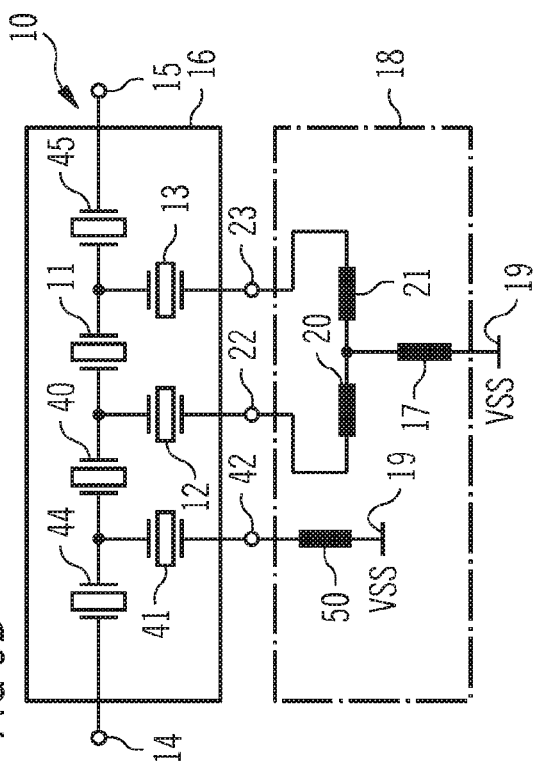

FIGS. 3A to 3D show further exemplary embodiments of the filter arrangement 10 according to the principle proposed. The embodiments are developments of the exemplary embodiments of the filter arrangement shown in FIGS. 1A, 1B, 2A and 2B. In FIG. 3A, the filter arrangement 10 additionally comprises a second series resonator 40, which is arranged between the first filter terminal 14 and the first series resonator 11. In this case, the first parallel resonator 12 couples a node between the first and second series resonators 11, 40 to the first connection of the first inductance 17. Furthermore, the filter arrangement 10 has a third parallel resonator 41, which connects a node between the first filter terminal 14 and the second series resonator 40 to the first connection of the first inductance 17. For this purpose, the substrate 16 has a third ground connection pad 42, via which the third parallel resonator 41 is coupled to the first connection of the first inductance 17. In addition, the carrier 18 comprises a third coupling inductance 43, which connects the third parallel resonator 41 to the first connection of the first inductance 17.

Furthermore, the filter arrangement 10 has a third series resonator 44, which couples the first filter terminal 14 to the second series resonator 40. The first connection of the third parallel resonator 41 is connected to a node between the second and third series resonators 40, 44. Furthermore, the filter arrangement 10 comprises an additional series resonator 45, which connects the first series resonator 11 to the second filter terminal 15. In this case, the first connection of the second parallel resonator 13 is connected to a node between the first series resonator 11 and the additional series resonator 45. The filter arrangement 10 thus has three parallel resonators 12, 13, 41 and four series resonators 11, 40, 44, 45. The filter arrangement 10 thus comprises at least three stages. Since the number of series resonators is greater than the number of parallel resonators, it is also possible to use the indication that the filter arrangement 10 has 3.5 stages.

In an alternative embodiment (not shown), the additional series resonator 45 is omitted and replaced by a conductor track.

In an alternative embodiment (not shown), the third series resonator 44 is omitted and replaced by a conductor track. In addition, the third parallel resonator 41 can optionally be omitted.

Figure 3C:
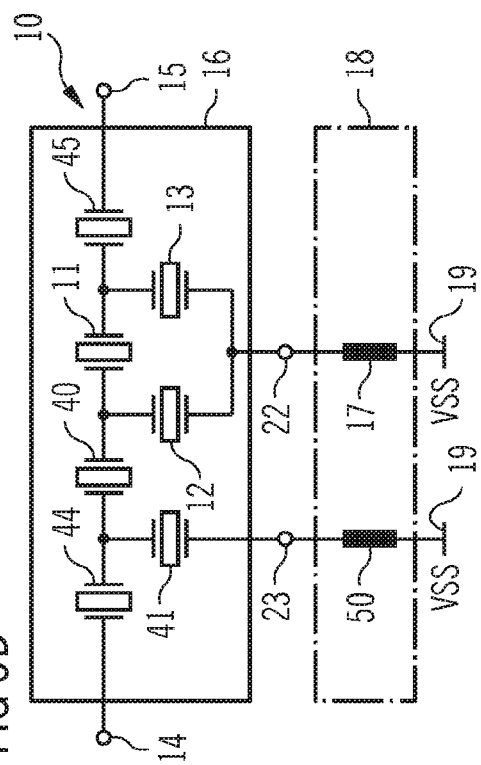
Figure 3B:
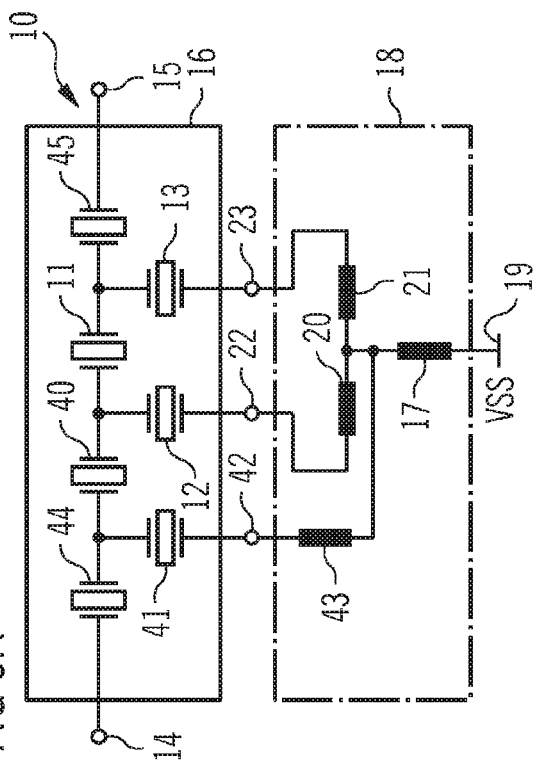

In FIG. 3B, the third parallel resonator 41 is connected to the reference potential connection 19 via a second inductance 50. The third parallel resonator 41 is therefore not coupled to the first inductance 17. Although this increases the area taken up on the carrier 18 for realizing the different inductances, the decoupling of the signals at the different parallel resonators 12, 13, 41 is improved. FIGS. 3A and 3B constitute a further development of the embodiment shown in FIGS. 1A and 1B. FIGS. 1A, 1B, 3A and 3B show at least two parallel resonators 12, 13 coupled to a common ground connection, which is realized as reference potential connection 19, via separate ground connection pads, namely the first and the second ground connection pad 22, 23, and via the common first inductance 17. The substrate 16 is realized as a bulk acoustic wave chip. The separate ground connection pads, namely the first, second and third ground connection pads 22, 23, 42, constitute bulk acoustic wave chip outputs.

The ceramic forming the carrier 18 can have five layers. By way of example, of five layers two are metallization layers and two are dielectric layers, also called insulation layers. A layer can have a thickness of 150 μm. The metal structures produced for realizing the first and second inductances 17, 50 in the ceramic are shielded relative to one another by means of ground isolators (not shown). As a result, mutual crosstalk is prevented and the required suppression and insulation levels are complied with. In addition, it is possible to produce ground shields (not shown) in the ceramic between the structures. Alternatively, the ceramic comprises six layers having a thickness of 125 μm in each case. A component area of 3.8×3.8 mm² can be reduced via an area of 3.0×2.5 mm² to an area of 2.5×2.0 mm². The component height decreases from a height of 1.2 mm to a maximum component height of 0.95 mm.

In FIG. 3C, the filter arrangement 10 comprises the second series resonator 40 and also the third parallel resonator 41. The third parallel resonator 41 connects a node between the second series resonator 40 and the first filter terminal 14 to the first connection of the first inductance 17. In this case, the first ground connection pad 22 connects the third parallel resonator 41 to the first connection of the first inductance 17. Advantageously, exclusively one ground connection, namely the first ground connection pad 22 is provided for connecting the first, second and third parallel resonators 12, 13, 41 to the first connection of the first inductance 17. Consequently, a very small number of connections between the substrate 16 and the carrier 18 is necessary. The number is one.

Furthermore, the filter arrangement 10 comprises the third series resonator 44 and also the additional series resonator 45. For connecting up the filter arrangement 10 comprising three parallel resonators, namely the first, second and third parallel resonators 12, 13, 41, exclusively one inductance, namely the first inductance 17, is necessary. In the case of a three-stage filter, it is possible to use a common ground connection, namely the first ground connection pad 22, of three parallel resonators, namely the first, second and third parallel resonators 12, 13, 41. Consequently, two large inductances and their space requirement can advantageously be saved. Since two or three parallel resonators are interconnected on the substrate 16, a ground connection pad can also be saved in addition to the area gained in the carrier 18. A ground connection pad typically has a circular area having a diameter of 125 μm. The area saving in the case of the connection pads can be used for increasing the areas of the series and parallel resonators on the substrate 16.

At least three parallel resonators 12, 13, 41 are connected to the first inductance 17 via a common ground connection, namely in the form of the first ground connection pad 22. Consequently, the first inductance 17 performs the function of at least three inductances which would otherwise in each case individually connect the corresponding parallel resonator to the reference potential. The first inductance 17 is distributed over a plurality of layers of the carrier 18 and thus over a plurality of ceramic layers. The first inductance 17 can be realized on that metallization layer of the carrier 18 which is closest to the substrate 16. The combination of a plurality of parallel resonators, such as the first, second and third parallel resonators 12, 13, 41, can be effected on the substrate 16 in accordance with FIG. 3C or on the carrier 18 in accordance with FIG. 3A. The combination of a plurality of parallel resonators 12, 13, 41 can be short and space-saving.

Figure 3D:
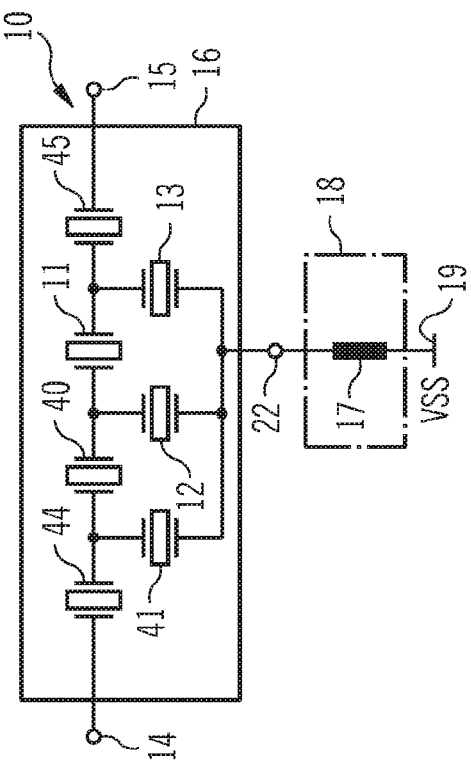

In FIG. 3D, the filter arrangement 10 comprises the second series resonator 40 and also the third parallel resonator 41.

The third parallel resonator 41 is connected to the reference potential connection 19 via the second ground connection pad 23 and the second inductance 50. Consequently, the number of parallel resonators is greater than the number of inductances connecting the parallel resonators to the reference potential connection 19. In the filter arrangement 10, the substrate 16 comprises three parallel resonators, namely the first, second and third parallel resonators 12, 13, 41, and the carrier 18 comprises two inductances, namely the first and second inductances 17, 50. FIGS. 3C and 3D constitute developments of the embodiments of the filter arrangement shown in FIGS. 2A and 2B. FIGS. 2A, 2B, 3C, 3D show at least two parallel resonators, in particular the first and second parallel resonators 12, 13, with a common first ground connection pad 22 in the substrate 16, wherein the first ground connection pad 22 is connected to the reference potential connection 19 via the common first inductance 17.

FIG. 4A shows an exemplary embodiment of a radio system 60. The radio system 60 has a duplexer 61. The duplexer 61 comprises a transmission filter 62 and a reception filter 63. The transmission filter 62 is realized in accordance with one of the embodiments of the filter arrangement 10 illustrated in the figures above. In the example shown in FIG. 4A, the transmission filter 62 is implemented in accordance with the embodiment illustrated in FIG. 3A. The duplexer 61 comprises in the transmission path two parallel resonators 12, 13, which are interconnected in the carrier 18, which is realized as a ceramic carrier. The reception filter 63 comprises the first, the second, the third and the additional series resonator 11, 40, 44, 45. Furthermore, the reception filter 63 comprises the first, the second, the third and a fourth parallel resonator 12, 13, 41, 64. The fourth parallel resonator 64 couples a node between the third series resonator 44 and the first filter terminal to the reference potential connection 19. The first, second, third and fourth parallel resonators 12, 13, 41, 64 are connected to the reference potential connection 19 via a respective inductance, namely the first, the second, a third and a fourth inductance 17, 50, 70, 71.

The duplexer 61 thus has a filter arrangement 10 having interconnected inductances and a further filter arrangement 10' having separate inductances. The first filter terminal 14 of the transmission filter 62 is connected to the second filter terminal 15 of the reception filter 63. The radio system 60 furthermore has a transmission amplifier 65, which connects an input 66 of the radio system 60 to the second filter terminal 15 of the transmission filter 62. The transmission amplifier 65 is embodied as a power amplifier. Furthermore, the radio system 60 comprises an antenna 67, which is connected to a node between the first filter terminal 14 of the transmission filter 62 and the second filter terminal 15 of the reception filter 63. Furthermore, the radio system 60 has a reception amplifier 68, which connects the first filter terminal 14 of the reception filter 63 to an output 69 of the radio system 60. The reception amplifier 68 is realized as a low noise amplifier.

A transmission signal TX is forwarded via the transmission amplifier 65 and the transmission filter 62 to the antenna 67. A reception signal SIG that can be tapped off at the antenna 67 is provided, via the reception filter 63 and the reception amplifier 68, as received signal RX at the output 69 of the radio system 60.

The duplexer 61 is designed to guide the transmission signal TX from the transmission amplifier 65 to the antenna 67 and the reception signal SIG from the antenna 67 to the reception amplifier 68. The duplexer 61 enables the radio system 60 to transmit and receive simultaneously. The radio system 60 is implemented as a transceiver circuit. For this purpose, in the duplexer 60, the transmission filter 62 and the reception filter 63 are in each case interconnected with one another and the mutual influencing is taken into account. The transmission filter 62 and the reception filter 63 each have at least one stage. A stage comprises a series resonator and a parallel resonator, which in each case individually form a resonant circuit having a resonant frequency. Consequently, the stage has one series and one parallel resonant frequency. Typically, the transmission filter 62 and the reception filter 63 each have two or three, occasionally also four, stages. The parallel resonant frequency of a stage is altered by the series connection of an inductance, such as, for example, the first and the second inductance 17, 50. In this case, the value of the resonant frequency is shifted. For this purpose, from each parallel resonator, a connection is led away from the substrate 16 and connected to the carrier 18.

The reference potential connection 19 is realized as overall duplexer ground. Thus, the first, second, third or fourth inductance 17, 50, 70, 71 can be connected between the parallel resonators 12, 13, 41, 64 and the reference potential connection 19 or a plurality of parallel resonators 12, 13, 41 can be connected to the reference potential connection 19 via the common first inductance 17.

Advantageously, the total length for the inductances in the ceramic of the carrier 18 and thus the total area for the inductances in the ceramic are realized by virtue of the fact that the parallel resonators 12, 13, 41 are not connected individually, but rather via common ground connection pads 22, 23 to the inductances 17, 50 in the ceramic and the inductances in the ceramic are thus used jointly.

With the use of a common ground connection, such as the first ground connection 22, for instance, two parallel resonators, such as the first and second parallel resonators 12, 13, for example, are interconnected via short line segments or very small inductance values and are connected via a significantly larger inductance, namely the first inductance 17, to the reference potential VSS. The inductance value of the first and second coupling inductances 20, 21 is less than the inductance value of the first inductance 17. In this case, the first and second coupling inductances 20, 21 have for example an inductance from a range of 0.1 to 0.3 nH. The first inductance 17 has values from a range of 0.5 to 2.0 nH. This saves area on the carrier 18 in comparison with the separate interconnection with two large inductances relative to the reference potential VSS. The area of the carrier 18 can thus be reduced. In accordance with FIGS. 2A and 2B, the first and second parallel resonators 12, 13 are interconnected on the substrate 16 and thus on the bulk acoustic wave chip, abbreviated to BAW chip. The two parallel resonators 12, 13 are led toward the outside exclusively via one connection, namely the first ground connection 22. Advantageously the interconnection of two parallel resonators 12, 13 affords a significant saving of inductance and thus area in comparison with the separate interconnection with two large inductances, for example 0.5 to 2.0 nH, relative to the reference potential VSS. The saving is typically 500×500 µm² over all layers; including the ground webs, the saving can reach 700×700 µm², for example. If both the transmission filter 62 and the reception filter 63 are realized according to the principle proposed, double the area can be saved. On account of the reduced space requirement, this obviates the need to provide further layers in the carrier 18 in the case of miniaturization steps in terms of the component area and height. Furthermore, it is not necessary to thin the required layers owing to the additional layers. Consequently, in the case of component miniaturization, panel costs are reduced as a result of a saving of the process costs during panel production.

As a result of the interconnection of two parallel resonators, such as the first and second parallel resonators 12, 13 for example, with a significantly smaller inductance value of the first inductance 17 it is possible to shift a pole pair toward low frequencies. As a result, one pole can be deliberately used for suppressing other interference frequencies. The reception filter 63 of the duplexer 61 can reduce the transmission signal TX in the frequency range of the Global Positioning System, abbreviated to GPS, between 1570 and 1580 MHz. Consequently, the GPS receiver in the cellular phone is subjected to less interference by the cellular phone transmission signal TX and is therefore more sensitive in telephony and standby operation. An additional pole is generated in the duplexer 61. The additionally generated pole produces a suppression of the transmission signal of at least −38 dB in the transmission filter 62. The functions of the duplexer 61 remain unaffected by the realization of the filter arrangement 10. With the aid of the first inductance 17, the filter arrangement 10 can be used in a frequency range which, with a conventional design, is achievable only with very high outlay.

In an alternative embodiment (not shown), the first and second parallel resonators 12, 13 of the reception filter 63 are interconnected and coupled to the reference potential connection 19 via the first inductance 17, and the third and fourth parallel resonators 41, 64 of the reception filter 63 are interconnected and coupled to the reference potential connection 19 via the second inductance 50.

In an alternative embodiment (not shown), the carrier has additional ground webs which decouple different structures on the carrier 18, in particular the inductances 17, 50, 20, 21.

FIG. 4B shows a further exemplary embodiment of the radio system 60. The transmission filter 62 is realized in accordance with the embodiment of the filter arrangement 10 as shown in FIG. 3D. The duplexer 61 has two parallel resonators 12, 13 combined in the substrate 16 in the transmission path. In FIGS. 4A and 4B, the reception and transmission filters 62, 63 are realized in each case as a bulk acoustic wave filter, abbreviated to BAW filter. The duplexer 61 is advantageously implemented as a BAW duplexer having common ground connections 22, 23, inductances being saved.

In an alternative embodiment (not shown in FIGS. 4A and 4B), at least one filter arrangement from a group comprising the reception filter 63 and the transmission filter 62 is embodied as a surface acoustic wave filter, abbreviated to SAW filter.

In an alternative embodiment (not shown in FIGS. 4A and 4B), the transmission filter 62 is realized in a different embodiment of the filter arrangement 10 as shown in the above figures.

In an alternative embodiment (not shown in FIGS. 4A and 4B), the reception filter 63 is realized with one of the embodiment of the filter arrangement 10 as shown in FIGS. 1A, 1B, 2A, 2B and 3A to 3D.

FIG. 5 shows an exemplary embodiment of a resonator. The resonator 80 can be used as a parallel or series resonator in the filter arrangement 10 in accordance with one of the above figures. The resonator is embodied as a film bulk acoustic wave resonator, abbreviated to FBAR. The resonator 80 is realized on the first main area 24 of the substrate 16. The resonator 80 has a first metal electrode 81, a piezoelectric layer 82 and also a second metal electrode 83, which are arranged one above another. The first metal electrode 81 does not touch the second metal electrode 83. The first and second metal electrodes 81, 83 form a plate capacitor having the piezoelectric layer 82 as an insulator layer. The first and second metal electrodes 81, 83 serve both for feeding current and voltage and as an acoustic mirror for an acoustic wave in the piezoelectric layer 82.

The substrate 16 is realized as a monocrystalline silicon substrate.

In an alternative embodiment (not shown), an insulator layer is arranged between the substrate 16 and the first metal electrode 81.

FIG. 6 shows an exemplary embodiment of an inductance 88. The inductance 88 in accordance with FIG. 6 can be inserted as first or second inductance 17, 50 or as coupling inductance 20, 21, 43 into a carrier 18 in accordance with one of the above figures. The inductance 88 is shown here in plan view. The inductance 88 comprises a spiral conductor track 84 in a metallization layer such as, for instance, the first metallization layer 25. One end of the conductor track 84 is connected to a connection 85 of the inductance. A further conductor track 86 in an adjacent metallization layer, for example the third metallization layer 27, connects the conductor track end situated in the inner portion of the spiral conductor track 84 to a further connection 87 of the inductance 88.

The conductor track 84 has at least one complete turn. Preferably, the conductor track 84 has at least two complete turns.

FIG. 7 shows an exemplary embodiment of the filter arrangement 10 in a housing. The carrier 18 is embodied as a ceramic carrier. The carrier 18 can be implemented as low-temperature co-fired ceramics, abbreviated to LTCC, or as high-temperature co-fired ceramics, abbreviated to HTCC. The carrier 18 is connected to the substrate 16 via two solder balls 32. The carrier 18 has the first metallization layer 25, which is embedded between two dielectric layers. The carrier 18 can be designated as a two-layered substrate. The connection pads for the first and second filter terminals 14, 15 are arranged on the second surface 31 of the carrier 18. The connection pad of the first and second filter terminals 14, 15 can in each case also be designated as a surface mounted device pad, abbreviated to SMD pad.

Furthermore, the filter arrangement 10 comprises a laminate 90, which covers a second main area of the substrate 16, the lateral edges of the substrate 16 and a region between the substrate 16 and the carrier 18. Furthermore, the laminate 90 is in turn covered by a hermetic coating 91. The coating 91 prevents moisture from penetrating into the interspace between the substrate 16 and the carrier 18. Consequently, the filter arrangement 10 is very compact.

In an alternative embodiment, the carrier 18 comprises more than two layers, such as, for instance, a six-layered substrate.

In an alternative embodiment (not shown), the transmission filter 62 and the reception filter 63 each have a dedicated substrate 16. The two substrates 16 of the transmission and reception filters 62, 63 are arranged jointly on the carrier 18. The connection pads at the second main area 31 of the carrier 18 connect the duplexer 61 to the transmission amplifier 65, the antenna 67, the reception amplifier 68 and the reference potential connection 19. The duplexer 61 is housed as shown in FIG. 7.

In an alternative embodiment (not shown), the duplexer 61, comprising the transmission filter 62 and the reception filter 63, has exclusively one substrate, namely the substrate 16, and one carrier, namely the carrier 18. The substrate 16 of the transmission and reception filters 62, 63 is arranged on the carrier 18. The connection pads at the second main area 31 of the carrier 18 connect the duplexer 61 to the transmission amplifier 65, the antenna 67, the reception amplifier 68 and the reference potential connection 19. The duplexer 61 is housed as shown in FIG. 7.

In an alternative embodiment (not shown), the carrier 18 is realized as a printed circuit board. The printed circuit board can be embodied as a multilayer printed circuit board. The first inductance 17 and the further inductances can be realized by means of at least one metallization layer of the printed circuit board.

FIGS. 8A to 8C show exemplary filter characteristics of the filter arrangement 10 according to the principle proposed. The respective variables are illustrated as a function of the frequency f. While FIGS. 8A and 8B show the insertion loss |S12| and |S23|, FIG. 8C illustrates the isolation |S13| as a function of the frequency f. FIG. 8B shows an excerpt from the characteristic from FIG. 8A. The bulk acoustic wave duplexer 61 has a structural size of 3.0*2.5 mm². The measurement curves identified by s show the characteristics of a transmission filter 62 without connected parallel resonators, an attenuation of 30 dB being obtained in the GPS frequency range. The measurement curves identified by r show the characteristics of a transmission filter 62 with connected parallel resonators, an attenuation of 38 dB being achieved in the GPS frequency range.

LIST OF REFERENCE SIGNS 10, 10' Filter arrangement
11 First series resonator
12 First parallel resonator
13 Second parallel resonator
14 First filter terminal
15 Second filter terminal
16 Substrate
17 First inductance
18 Carrier
19 Reference potential connection
20 First coupling inductance
21 Second coupling inductance
22 First ground connection pad
23 Second ground connection pad
24 First main area
25 First metallization layer
26 Second metallization layer
27 Third metallization layer
28 First connection pad
29 Second connection pad
30 First main area
31 Second main area
32 Solder ball
40 Second series resonator
41 Third parallel resonator
42 Third ground connection pad
43 Third coupling inductance
44 Third series resonator
45 Additional series resonator
50 Second inductance
60 Radio system
61 Duplexer
62 Transmission filter
63 Reception filter
64 Fourth parallel resonator
65 Transmission amplifier
66 Input
67 Antenna
68 Reception amplifier
69 Output
70 Third inductance
71 Fourth inductance
80 Resonator
81 First metal electrode
82 Piezoelectric layer
83 Second metal electrode
84 Conductor track
85 Connection
86 Further conductor track
87 Further connection
88 Inductance
88 Laminate
90 Coating
f Frequency
RX Received signal
SIG Reception signal
TX Transmission signal
VSS Reference potential

The invention claimed is:

1. A duplexer, comprising a transmission filter and a reception filter, wherein at least one filter from a group comprising the transmission filter and the reception filter has a filter arrangement comprising:
   a substrate having a first series resonator and also a first and a second parallel resonator; and
   a carrier, on which the substrate is arranged and which comprises a first inductance, the first connection of which is coupled to a first connection of the first series resonator via the first parallel resonator and to a second connection of the first series resonator via the second parallel resonator,
   wherein
   the substrate is connected to the carrier using flip-chip technology,
   the substrate comprises a first ground connection pad, which is connected to the first and second parallel resonators and also the first connection of the first inductance,
   at least one resonator from a group comprising the first series resonator and also the first and second parallel resonators is realized as a bulk acoustic wave resonator,
   the carrier comprises at least one substrate from a group comprising a printed circuit board and a ceramic substrate, in particular an LTCC or an HTCC,
   the first inductance is integrated in the carrier and is realized as a planar coil,
   the planar coil is produced in at least one metallization layer and has a spiral conductor track, or is produced in at least two metallization layers and has turns lying one above another, and
   an interconnection of the first and second parallel resonators generates at least one pole for suppressing spurious frequency.

2. The duplexer according to claim 1, wherein the substrate is realized as a mono-crystalline substrate having a first main area, at which the first series resonator and also the first and second parallel resonators are arranged.

3. The duplexer according to claim 1 or 2, wherein the substrate is realized as a mono-crystalline semiconductor body, in particular silicon body, or as a monocrystalline insulator body, in particular quartz body.

4. The duplexer according to claim 1, the substrate comprising:
   at least one further series resonator, which is connected in series with the first series resonator; and
   at least one further parallel resonator, which couples the first connection of the inductance to a connection of the further series resonator.

5. The duplexer according to claim 1, the carrier comprising at least one insulation layer and at least two metallization layers.

* * * * *